(12) United States Patent
Koivuranta (10) Patent No.: US 10,726,582 B2
(45) Date of Patent: Jul. 28, 2020

(54) METHOD AND SYSTEM FOR DETERMINING LONE TEMPERATURE OF OVERHEAD POWER LINE

(71) Applicant: Sharper Shape Oy, Espoo (FI)

(72) Inventor: Ville Koivuranta, Helsinki (FI)

(73) Assignee: Sharper Shape Oy, Espoo (FI)

( * ) Notice: Subject to any disclaimer, the term of this patent is extended or adjusted under 35 U.S.C. 154(b) by 371 days.

(21) Appl. No.: 15/922,425

(22) Filed: Mar. 15, 2018

(65) Prior Publication Data

US 2019/0287269 A1 Sep. 19, 2019

(51) Int. Cl.
| | |
|---|---|
| *G06T 7/90* | (2017.01) |
| *G06T 7/00* | (2017.01) |
| *G06T 1/00* | (2006.01) |
| *G01R 19/15* | (2006.01) |
| *G01K 7/42* | (2006.01) |
| *G01K 13/00* | (2006.01) |
| *G01R 19/25* | (2006.01) |
| *G01K 1/08* | (2006.01) |
| *G01K 3/06* | (2006.01) |

(52) U.S. Cl.
CPC ............... *G06T 7/90* (2017.01); *G01K 1/08* (2013.01); *G01K 3/06* (2013.01); *G01K 7/42* (2013.01); *G01K 13/00* (2013.01); *G01R 19/15* (2013.01); *G01R 19/2513* (2013.01); *G06T 1/0007* (2013.01); *G06T 7/0004* (2013.01); *B64C 2201/14* (2013.01)

(58) Field of Classification Search
CPC .. G01K 1/08; G01K 3/06; G01K 7/42; G01K 13/00; G06T 7/90; G06T 1/0007; G06T 7/0004; G01R 19/15; G01R 19/2513; B64C 2201/14
See application file for complete search history.

(56) References Cited

U.S. PATENT DOCUMENTS

| | | | | |
|---|---|---|---|---|
| 4,635,055 A | * | 1/1987 | Fernandes | G01K 1/024 323/357 |
| 2004/0101024 A1 | * | 5/2004 | Kawai | G01K 1/024 374/141 |
| 2011/0137483 A1 | * | 6/2011 | Jenkins | H02J 3/00 700/293 |

(Continued)

*Primary Examiner* — Regis J Betsch
(74) *Attorney, Agent, or Firm* — Ziegler IP Law Group LLC (57) ABSTRACT

A method for determining a lone temperature of an overhead power line of a power transmission setup. The method includes capturing an image of a section of the power transmission setup. The image of the section represents the overhead power line carrying current and a non-current carrying element of the power transmission setup. The method also includes analyzing the captured image to determine temperatures of the overhead power line and the non-current carrying element. The temperature of the overhead power line is based on a heat generated by the carried current and an environmental factor around the section of the power transmission setup, and the temperature of the non-current carrying element is based on the environmental factor. The method further includes using the determined temperatures of the overhead power line and the non-current carrying element for determining the lone temperature of the overhead power line.

16 Claims, 2 Drawing Sheets

(56) References Cited

U.S. PATENT DOCUMENTS

| | | | | |
|---|---|---|---|---|
| 2011/0238374 A1* | 9/2011 | Lancaster | H02J 13/00002 | 702/184 |
| 2012/0019622 A1* | 1/2012 | Rousselle | G06F 17/00 | 348/46 |
| 2012/0197558 A1* | 8/2012 | Henig | G01K 11/265 | 702/58 |
| 2013/0191066 A1* | 7/2013 | Spillane | H02G 7/00 | 702/135 |

* cited by examiner

METHOD AND SYSTEM FOR DETERMINING LONE TEMPERATURE OF OVERHEAD POWER LINE

TECHNICAL FIELD

The present disclosure relates generally to inspection of power transmission setup; and more specifically, to a method and a system for measuring a lone temperature of an overhead power line of a power transmission setup.

BACKGROUND

Transmission of bulk electric energy across long distances is accomplished by a power transmission setup. Typically, such power transmission setup uses overhead power lines for the transmission of the electric energy. The overhead power lines are bare-wire conductors generally made of aluminium and optionally reinforced with steel. Generally, temperature of such overhead power lines is dependent on the current flowing therethrough. Moreover, a higher transmission load and fluctuations in the transmission load may cause further increase in the temperature of the overhead power lines.

Conventionally, the temperature of the overhead power lines is measured using techniques, which use mechanical tension sensors (MTS), surface acoustic wave (SAW) sensors, cameras, such as thermal cameras, and so forth. However, such temperature measuring techniques suffer from various problems. For example, the temperature of the overhead power line is influenced by various other factors, apart from a transmission load subjected to the overhead power lines, which are not accounted by such conventional techniques. Therefore, measured temperature of the overhead power lines may not be accurate and accordingly further calculations based on such measurements may lead to erroneous results that may affect commissioning data for a power transmission setup.

Therefore, in light of the foregoing discussion, there exists a need to overcome the aforementioned drawbacks associated with temperature measurement of an overhead power line of a power transmission setup.

SUMMARY

The present disclosure seeks to provide a method for determining a lone temperature of an overhead power line of a power transmission setup. The present disclosure also seeks to provide a system for determining a lone temperature of an overhead power line of a power transmission setup. The present disclosure seeks to provide a solution to the existing problem of temperature measurement of the overhead power line. An aim of the present disclosure is to provide a solution that overcomes at least partially the problems encountered in prior art, and provide accurate measurement of a lone temperature of the overhead power line.

In one aspect, an embodiment of the present disclosure provides a method for determining a lone temperature of an overhead power line of a power transmission setup, the method comprising:
    capturing an image of a section of the power transmission setup, wherein the image of the section represents the overhead power line carrying current and a non-current carrying element of the power transmission setup;
    analyzing the captured image to determine temperatures of the overhead power line and the non-current carrying element, wherein
        the temperature of the overhead power line is based on a heat generated by the carried current of the overhead power line and an environmental factor around the section of the power transmission setup, and
        the temperature of the non-current carrying element is based on the environmental factor; and
    using the determined temperatures of the overhead power line and the non-current carrying element for determining the lone temperature of the overhead power line.

In another aspect, an embodiment of the present disclosure provides a system for determining a lone temperature of an overhead power line of a power transmission setup, the system comprising:
    an image capturing module operable to capture an image of a section of the power transmission setup, wherein the image of the section represents the overhead power line carrying current and a non-current carrying element of the power transmission setup; and
    an image processing module operable to
        analyze the captured image to determine temperatures of the overhead power line and the non-current carrying element, wherein
            the temperature of the overhead power line is based on a heat generated by the carried current of the overhead power line and an environmental factor around the section of the power transmission setup, and
            the temperature of the non-current carrying element is based on the environmental factor, and
        use the determined temperatures of the overhead power line and the non-current carrying element to determine the lone temperature of the overhead power line.

Embodiments of the present disclosure substantially eliminate or at least partially address the aforementioned problems in the prior art, and enable in determining accurate measurement of the lone temperature of the overhead power line.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although, some modes of carrying out the present disclosure have been disclosed, those skilled in the art would recognize that other embodiments for carrying out or practicing the present disclosure are also possible.

In one aspect, an embodiment of the present disclosure provides a method for determining a lone temperature of an overhead power line of a power transmission setup, the method comprising:

capturing an image of a section of the power transmission setup, wherein the image of the section represents the overhead power line carrying current and a non-current carrying element of the power transmission setup;

analyzing the captured image to determine temperatures of the overhead power line and the non-current carrying element, wherein the temperature of the overhead power line is based on a heat generated by the carried current of the overhead power line and an environmental factor around the section of the power transmission setup, and the temperature of the non-current carrying element is based on the environmental factor; and using the determined temperatures of the overhead power line and the non-current carrying element for determining the lone temperature of the overhead power line.

In another aspect, an embodiment of the present disclosure provides a system for determining a lone temperature of an overhead power line of a power transmission setup, the system comprising:

an image capturing module operable to capture an image of a section of the power transmission setup, wherein the image of the section represents the overhead power line carrying current and a non-current carrying element of the power transmission setup; and an image processing module operable to analyze the captured image to determine temperatures of the overhead power line and the non-current carrying element, wherein the temperature of the overhead power line is based on a heat generated by the carried current of the overhead power line and an environmental factor around the section of the power transmission setup, and the temperature of the non-current carrying element is based on the environmental factor, and use the determined temperatures of the overhead power line and the non-current carrying element to determine the lone temperature of the overhead power line.

The present disclosure provides a method and a system for efficiently and accurately measuring a lone temperature of the overhead power line. The measurement is based only on the heat produced by the current carried by the overhead power line, without any influence from the environmental factor or metallurgical characteristics of the overhead power line. Beneficially, the accurate temperature of the overhead power line may be used to determine an optimum load capacity of the overhead power line, which may increase longevity of the overhead power line and reduces power loss during the transmission. Additionally, the above data may be used for commissioning of the power transmission setup, while accommodating data related to the sag of the overhead power line and achieving a safe clearance distance. It will be appreciated that the present disclosure may enable in managing the safe clearance distance for the overhead power line with respect to ground or any physical element in proximity to the overhead power line. This further enables in performing inspection and maintenance related tasks associated with the overhead power line. For example, based on the present disclosure, a maximum sag for an overhead power line may be calculated based on a load condition and an environmental factor. Accordingly, based on the maximum sag, the load condition for the overhead power line may be regulated; otherwise an inspection and/or maintenance task may be initiated for managing the physical elements in proximity to the overhead power line to maintain the safe clearance distance therebetween.

Throughout the present disclosure, the term 'power transmission setup' relates to an arrangement employing various electrical and mechanical components for the purpose of distributing electric power. The electrical components comprises transmission towers or pylons, overhead power lines, earth wires, spacers, insulators, cross wires, dampers, and the likes. Further, the power transmission setup majorly used for transmission of the alternating current (AC) produced at power plants. The electrical power is mainly transmitted using the overhead power lines. The overhead power lines are bare-wires, conductive in nature, and suspended from the transmission towers or pylons. Optionally, the overhead power lines are made of aluminium or reinforcement with steel (such as aluminium-conductor steel-reinforced (ACSR)), carbon, or glass fiber (such as aluminium-conductor composite core (ACCC)).

According to an embodiment, the overhead power lines are positioned beneath the non-current carrying element. The non-current carrying element or earth wire is suspended from or positioned at a top of the transmission towers or pylons. The non-current carrying element is conductive in nature, however, no current is allowed to flow through such non-current carrying element. The non-current carrying element enables in protecting the power transmission setup from a potential damage of lightning. Optionally, the non-current carrying element is a lightning rod.

It will be appreciated that the current flowing through the overhead power line produces heat that increases the temperature of the overhead power line. Further, the temperature of the overhead power lines is also influenced by various environmental factors. Therefore, the temperature of the overhead power line is based on a heat generated by the carried current of the overhead power line and an environmental factor around the section of the power transmission setup. However, the temperature of the non-current carrying element is based on the environmental factor. Optionally, the environmental factor includes at least one of ambient temperature, wind and humidity.

The temperature of the overhead power line is determined using image processing. As mentioned above, an image of a section of the power transmission setup is captured, wherein the image of the section represents the overhead power line carrying current and a non-current carrying element of the power transmission setup. According to an embodiment, the capturing of the image of the section of the power transmission setup is carried out using an unmanned aerial vehicle.

In one embodiment, the unmanned aerial vehicle may be an aircraft without human pilots on-board. Further, the unmanned aerial vehicle may be operated fully or partially autonomously for real-time applications, using on-board computers or remotely located human operators. Optionally, the unmanned aerial vehicle may be operated from a ground control station communicably coupled to the unmanned aerial vehicle. Optionally, the unmanned aerial vehicle may be used for applications such as aerial photography, aerial surveillance, aerial inspection, and so forth. The unmanned aerial vehicle may include information related to a task to be performed and then operated accordingly. For example, such task may be capturing an image of a section of the power transmission setup that may be used for determining temperature of an overhead power line of the power transmission setup.

According to an embodiment, for the purpose of temperature measurement, the unmanned aerial vehicle comprises at least one sensor. For example, the at least one sensor may include an image sensor associated with a camera. In an embodiment, the image sensor is an infrared sensor, such as a thermal infrared sensor, of an infrared camera. The infrared sensor emits and detects certain amount of reflected blackbody radiation. Optionally, the reflected blackbody radiation is a function of the temperature of a target object, and such blackbody radiations may be infrared radiations. In an example, the target object may be the section, of the power transmission setup, having the overhead power line carrying current and the non-current carrying element.

In one embodiment, the unmanned aerial vehicle comprises additional sensors, such as a proximity sensor, a distance sensor, a motion sensor, or an electromagnetic sensor, mounted on the unmanned aerial vehicle. The additional sensors may enable the unmanned aerial vehicle to manage a flight plan thereof and perform various tasks associated with the flight plan. In an embodiment, the flight plan of the unmanned aerial vehicle includes at least one image capturing point from where the unmanned aerial vehicle captures the image of the section of the power transmission setup.

According to an embodiment, the image capturing point relates to a geometrical coordinate from where the unmanned aerial vehicle (i.e. the infrared camera thereof) captures the image of the section of the power transmission setup. In an example, the image capturing point comprises a view-point and a view-direction for the unmanned aerial vehicle with respect to the section of the power transmission setup to be captured. Optionally, the view-point defines the geometrical coordinate and the view-direction defines a direction along which the unmanned aerial vehicle captures the image the section of the power transmission setup.

In one embodiment, the image capturing point may be located at a certain distance away from the overhead power line and the non-current carrying element. For example, the image capturing point may be located at different distances from the overhead power line and the non-current carrying element, i.e. at one instance the image capturing point may be closer to the overhead power line and away from the non-current carrying element, and at another instance the image capturing point may be closer to the non-current carrying element and away from the overhead power line. Alternatively, the image capturing point may be located at a distance substantially equidistant from the overhead power line and the non-current carrying element.

As mentioned above, the method comprises analyzing the captured image to determine temperatures of the overhead power line and the non-current carrying element, wherein the temperature of the overhead power line is based on a heat generated by current carried by the overhead power line and an environmental factor around the power transmission setup, and the temperature of the non-current carrying element is based on the environmental factor.

Optionally, the method comprises determining temperatures of the overhead power line and the non-current carrying element based on image processing. Further, it will be appreciated that the temperature of the overhead power line is determined as a function of the heat produced by the current flowing therethrough and the environmental factors subjected thereto. However, the temperature of the non-current carrying element is determined as a function of only the environmental factors subjected thereto.

In an embodiment, the processing of the image of the section of the power transmission setup includes processing of the infrared radiations associated with the overhead power line carrying current and the non-current carrying element. It will be appreciated that the captured image accordingly includes the overhead power line carrying current and the non-current carrying element represented with different colours, based on the amount of heat radiated therefrom. For example, a portion of the captured image associated with the overhead power line, i.e. carrying current and emitting more heat, may be represented using bright white colour. Further, a portion of the captured image associated with the non-current carrying element, i.e. not carrying current and emitting less heat, may be represented using yellow colour. Therefore, based on the analysis of the colours of the image of the section of the power transmission setup, temperatures of the overhead power line carrying current and the non-current carrying element is determined. It will be appreciated that the infrared radiations associated with the overhead power line and the non-current carrying element is influenced by the environmental factor. Therefore, the processing of the image of the section of the power transmission setup is also based on the environmental factor influencing the temperature of the overhead power line and the non-current carrying element.

According to an embodiment, as mentioned above, the environmental factor includes at least one of ambient temperature, humidity, wind. For example, the environmental factor may include speed of the wind, direction of the wind, ice load, solar radiation, radiation cooling, snow, thunderstorms, rain, and the likes. It will be appreciated that the environmental factor contributes significantly towards increase in temperature of the overhead power lines, thereby leading to thermal expansion of the overhead power lines. Further, the thermal expansion of the overhead power lines contribute significantly to sag of the overhead power lines. Additionally, the sag of the overhead power lines further increases when certain environmental factors and load conditions are met. For example, excessive transmission load and high ambient temperature may cause temporal sag of the overhead power lines.

As mentioned above, the method further comprises using the determined temperatures of the overhead power line and the non-current carrying element for determining the lone temperature of the overhead power line. The term 'lone temperature' used herein relates to a sole and accurate temperature of the overhead power line as a function of only the current flowing through the overhead power line. It will be evident that the lone temperature preludes any influence from the environmental factor.

Optionally, determining the lone temperature of the overhead power line includes subtracting the determined temperature of the non-current carrying element from the determined temperature of the overhead power line. For example, if the determined temperature of the overhead power line (influenced by the carried current as well as the environmental factor) is 100° C., and the determined temperature of the non-current carrying element (influenced by only the environmental factor) is 40° C., then the lone temperature of the overhead power line is 60° C. Therefore, the lone temperature of the overhead power line is a compensated temperature of the overhead power line based only on the current carried by the overhead power line without any influence from the environmental factor.

According to an embodiment, the method further comprises acquiring information related to formational-attributes of the overhead power line. Optionally, the formational-attributes of the overhead power line may comprise information related to the constituents of the overhead power line. More optionally, the formational-attributes of the overhead power line may comprise information such as a material (such as steel, aluminium, or an alloy thereof), an age, a surface treatment of the material, and so forth.

In an example, the formational-attributes of the overhead power line may be acquired using photographs or sensors. Specifically, the photographs or sensors may be used to determine such formational-attributes by measuring a change in colour and/or reflectance of the overhead power line that is currently in use with respect to a reference wire (i.e. new or unused overhead power line). In another example, the formational-attributes of the overhead power line may be acquired from pre-existing documents, such as construction plans, blueprints, or utility company database records.

According to an embodiment, the temperature and the load capacity (or ampacity) of the overhead power line is influenced by the formational-attributes and the environmental factors (wind, ambient temperature, humidity) subjected thereto. Specifically, the load capacity of the overhead power line is inversely proportional to the temperature of the overhead power line. More specifically, higher temperature of the overhead power line, due to solar radiation and higher ambient temperature, reduces the load capacity of the overhead power line by interfering with its emissivity. It will be appreciated that the reduced load capacity and emissivity of the overhead power line further increases the temperature and temperature-associated sag of the overhead power line. Optionally, the emissivity of the overhead power line may vary in a range of 0.2 to 0.8. Further, the load capacity of overhead power line may be influenced by the surface area of the overhead power line exposed to solar radiation. For example, the ampacity of ACSR overhead power line may be lower due to its larger diameter (hence surface area) as compared to the AAC (all-aluminium conductor) overhead power line.

In an example, the increased wind speed significantly increases the load capacity of the overhead power line by increasing the convection of heat away from the overhead power line to the surroundings. Optionally, the increased convection of heat away from the overhead power line is caused by the wind flowing in a direction perpendicular to the axis of the overhead power line. Further, humidity and dense air increases the convection of heat away from the conductor and thereby increases the load capacity of the overhead power line.

Further, the formational attributes influence the temperature and the emissivity of the overhead power line. For example, the corroded or dirty overhead power lines may absorb about 90% of solar radiation as compared with the 20-30% absorption by the newly placed overhead power line. Additionally, surface treatment on the material of the overhead power line influences the emissivity of the overhead power line. For example, surface coating of the overhead power line exhibits improved heat dissipation of higher emissivity.

According to another embodiment, the method further comprises using the information related to the formational-attributes, along with the determined temperatures of the overhead power line and the non-current carrying element, to determine the lone temperature of the overhead power line. In an example, if the determined temperature of the overhead power line (influenced by the carried current as well as environmental factor) is 100° C., and the determined temperature of the non-current carrying element (influenced by only the environmental factor) is 40° C. Further, upon acquiring information related to the formational-attributes of the overhead power line, it is observed that approximately temperature of about 5° C. is contributed by the formational-attributes. In such instance, the lone temperature of the overhead power line may further be refined by subtracting the determined temperature of the non-current carrying element, i.e. 40° C., and the temperature contribution from the from the formational-attributes, i.e. 5° C., from the determined temperature of the overhead power line, i.e. 100° C. Therefore, the lone temperature of the overhead power line is 55° C. More optionally, the lone temperature of the overhead power line is the compensated temperature overhead power line which is a factor of only the current carried through the overhead power line; and having no influence from the environmental factors or the material of the overhead power line.

The present disclosure also relates to the system as described above. Various embodiments and variants disclosed above apply mutatis mutandis to the system.

As mentioned above, the system comprises the image capturing module operable to capture the image of the section of the power transmission setup. The system also comprises the image processing module operable to analyze the captured image to determine temperatures of the overhead power line and the non-current carrying element; and use the determined temperatures of the overhead power line and the non-current carrying element to determine the lone temperature of the overhead power line.

According to an embodiment, the image capturing module and the image processing module are implemented by way of hardware, software, firmware or a combination of these, suitable for controlling operation of the system. It will be appreciated that the image capturing module includes at least a camera and a software that in combination is operable to capture the image of the section of the power transmission setup. Similarly, the image capturing module includes at least a processor and a software that in combination is operable to analyze the captured image to determine temperatures of the overhead power line and the non-current carrying element and determine the lone temperature of the overhead power line.

According to an embodiment, the unmanned aerial vehicle comprises the image capturing module and the image processing module. In such instance, the image capturing module and the image processing module are integrated and implemented at the unmanned aerial vehicle. It will be appreciated that in such instance the unmanned aerial vehicle also includes a processor for implementing the image capturing module and the image processing module. Accordingly, the unmanned aerial vehicle is operable to capture the image of the section of the power transmission setup and process the captured image to determine the lone temperature of the overhead power line.

According to another embodiment, the unmanned aerial vehicle is communicably coupled to a ground control station, and wherein the unmanned aerial vehicle comprises the image capturing module and the ground control station comprises the image processing module. In such instance, the image capturing module is integrated and implemented at the unmanned aerial vehicle, whereas the image processing module is integrated and implemented at the ground control station. It will be appreciated that in such instance each of the unmanned aerial vehicle and the ground control station includes a processor for implementing the image capturing module and the image processing module, respectively. The unmanned aerial vehicle is accordingly operable to capture the image of the section of the power transmission setup, and the ground control station is operable to process the captured image to determine the lone temperature of the overhead power line based on the captured image.

According to an embodiment, the unmanned aerial vehicle is communicably coupled to the ground control station using a communication network. In an example, the communication network includes but not limited to, a cellular network, short range radio (for example, such as Bluetooth®), Internet, a wireless local area network, and an Infrared Local Area Network, or any combination thereof.

Optionally, the system further comprises at least one database communicably coupled to the image processing module with the communication network. In an embodiment, the at least one database comprises formational-attributes of the overhead power line. In such instances, the image processing module is operable to use the formational-attributes along with the determined temperatures of the overhead power line and the non-current carrying element to determine the lone temperature of the overhead power line. It will be appreciated that in such instance the image processing module is configured to determine the lone temperature of the overhead power line by compensating the effect of environmental factor and the formational-attributes that may influence the temperature of the overhead power line.

According to one embodiment, the image capturing module is also operable to derive a flight plan for the unmanned aerial vehicle. For example, the flight plan may include information regarding a flight path and tasks to be performed by the unmanned aerial vehicle, such as capturing an image of the section of the power transmission setup, along the flight path. It will be appreciated that, accordingly the image capturing module may be operable to identify an image capturing point, for the unmanned aerial vehicle, from where the image of the section of the power transmission setup is to be captured.

In an embodiment, the image capturing point may be acquired from a pre-existing data or may be created in a real-time. For example, the pre-existing and real-time data may be generated using a sensor, such as Light Detection and Ranging (LiDAR), mounted on the unmanned aerial vehicle. Further, as mentioned above, the image capturing point may be located at different distances from the overhead power line and the non-current carrying element; therefore such distances may influence measurement of intensities of the infrared radiations associated therewith. For example, the intensity of the infrared radiations may be inversely proportional to a distance from where infrared radiation intensity is measured. In such instance, the distances of the overhead power line and the non-current carrying element from the image capturing point may be measured using a LiDAR data, and thereafter the difference between the measured distances may be calculated. Further, the calculated difference between the distances may be compensated (or taken into account) based on a predetermined value of infrared radiation intensity associated with a predetermined distance. For example, the predetermined value of infrared radiation intensity may be added to or subtracted from a measured infrared radiation intensity (of the overhead power line and the non-current carrying element) based on the predetermined distance.

In one embodiment, the unmanned aerial vehicle comprises at least one sensor. Optionally, the at least one sensor is one of an image sensor, a proximity sensor, a distance sensor, a motion sensor, and an electromagnetic sensor. More optionally, the image sensor is an infrared sensor. It will be appreciated that such sensors may enable the unmanned aerial vehicle to follow the flight plan, i.e. to follow the flight path and perform the task of capturing (the image of the section of the power transmission setup) along the flight path.

According to an embodiment, the system further comprises a memory unit configured to store information associated with the captured image of the section, the determined temperatures and the at least one sensor. It will be appreciated that the memory unit is associated with both the unmanned aerial vehicle and the ground control station, such that the memory unit is configured to store information and enables in retrieving the stored information for the processing thereof. Therefore, each of the unmanned aerial vehicle and the ground control station includes a memory unit for storing required information that enables implementing the system.

DETAILED DESCRIPTION OF THE DRAWINGS

Figure 1:
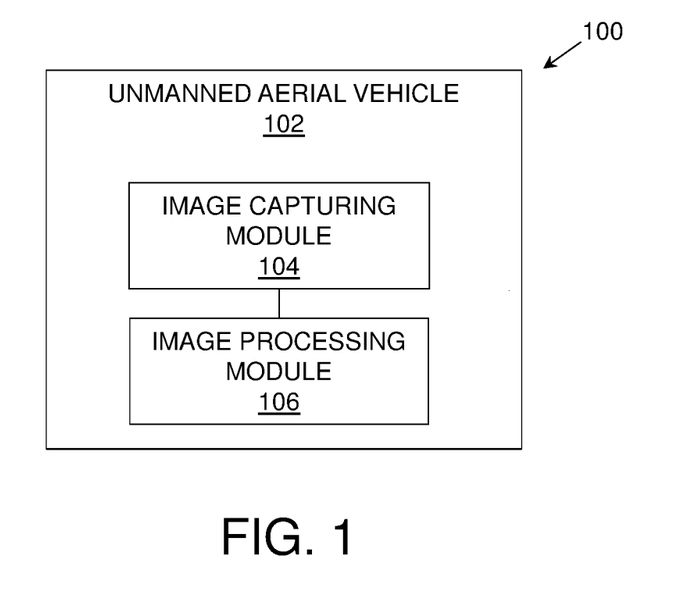
FIGS. 1 and 2 are block diagrams of systems for determining a lone temperature of an overhead power line of a power transmission setup, in accordance with various embodiments of the present disclosure.

Referring to FIG. 1, illustrated is a block diagram of a system 100 for determining a lone temperature of an overhead power line of a power transmission setup, in accordance with an embodiment of the present disclosure. The system 100 comprises an unmanned aerial vehicle 102 having an image capturing module 104 and an image processing module 106.

Figure 2:
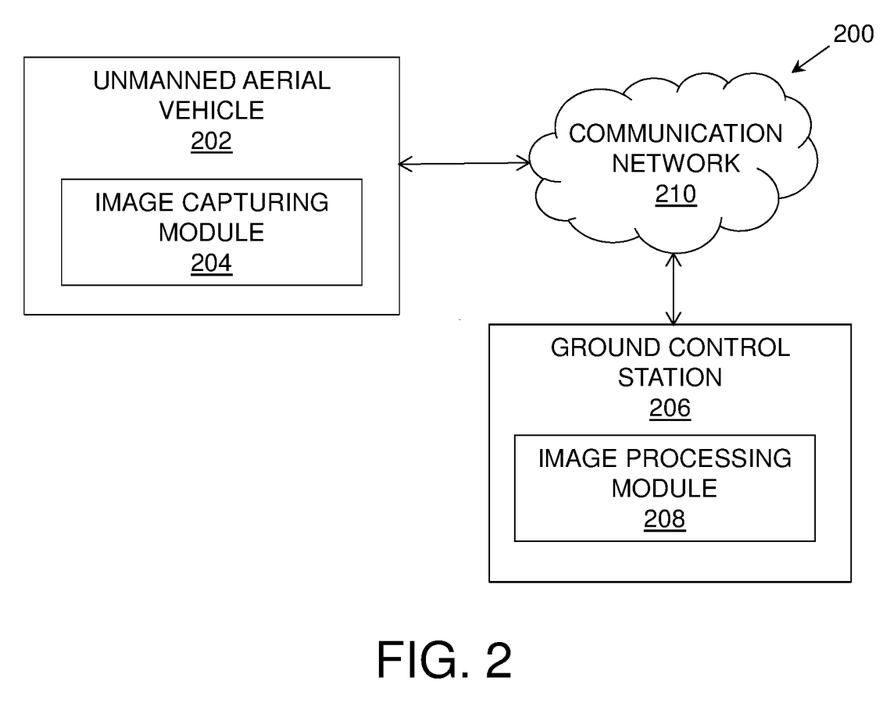

Referring to FIG. 2, illustrated is a block diagram of a system 200 for determining a lone temperature of an overhead power line of a power transmission setup, in accordance with another embodiment of the present disclosure. The system 200 comprises an unmanned aerial vehicle 202 having an image capturing module 204, and a ground control station 206 having an image processing module 208. The unmanned aerial vehicle 202 is communicably coupled to the ground control station 206 using a communication network 210.

Figure 3:
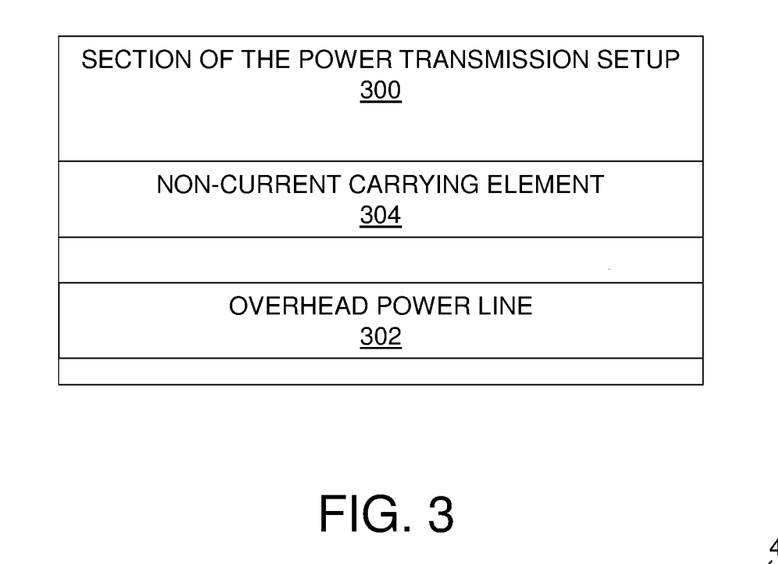
FIG. 3 is a schematic illustration of a section of the power transmission setup, in accordance with an embodiment of the present disclosure.

Referring to FIG. 3, illustrated is schematic illustration of a section of the power transmission setup, in accordance with an embodiment of the present disclosure. As shown, the section 300 of the power transmission setup includes an overhead power line 302, i.e. carrying current therethrough, and a non-current carrying element 304 of the power transmission setup.

Figure 4:
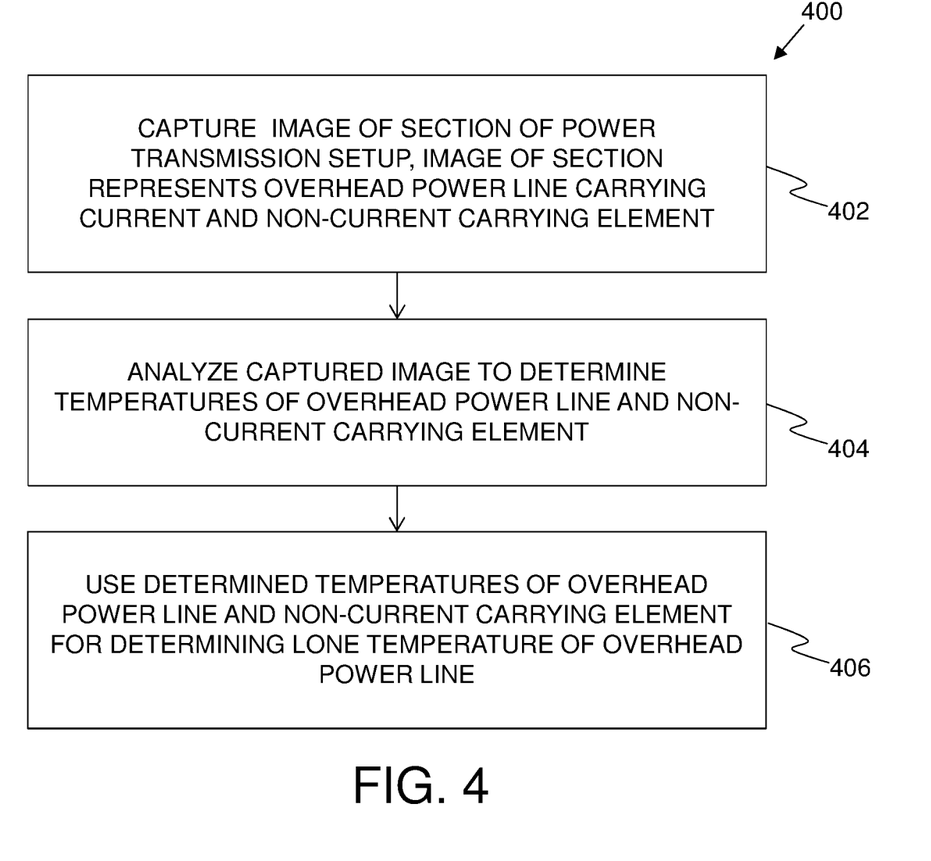
FIG. 4 illustrates steps of a method for determining a lone temperature of an overhead power line of a power transmission setup, in accordance with an embodiment of the present disclosure.

Referring to FIG. 4, illustrated are steps of a method 400 for determining a lone temperature of an overhead power line of a power transmission setup, in accordance with an embodiment of the present disclosure. At step 402, an image of a section of the power transmission setup is captured, wherein the image of the section represents the overhead power line carrying current and a non-current carrying element of the power transmission setup. At step 404, the captured image is analyzed to determine temperatures of the overhead power line and the non-current carrying element, wherein the temperature of the overhead power line is based on a heat generated by the carried current of the overhead power line and an environmental factor around the section of the power transmission setup, and the temperature of the non-current carrying element is based on the environmental factor. At step 406, the determined temperatures of the overhead power line and the non-current carrying element are used for determining the lone temperature of the overhead power line.

The steps 402 to 406 are only illustrative and other alternatives can also be provided where one or more steps are added, one or more steps are removed, or one or more steps are provided in a different sequence without departing from the scope of the claims herein. In an example, in the method 400, determining the lone temperature of the overhead power line may include subtracting the determined temperature of the non-current carrying element from the determined temperature of the overhead power line. Optionally, in the method 400, the environmental factor may include at least one of: ambient temperature, humidity, wind. In an example, the method 400 further comprises acquiring information related to formational-attributes of the overhead power line; and using the information related to the formational-attributes, along with the determined temperatures of the overhead power line and the non-current carrying element, for determining the lone temperature of the overhead power line. Optionally, in the method 400, the formational-attributes comprise at least one of: a material, an age and a surface treatment of the overhead power line. Optionally, in the method 400, the capturing of the image of the section of the power transmission setup is carried out using an unmanned aerial vehicle.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method for determining a lone temperature of an overhead power line of a power transmission setup, the method comprising:
   capturing an image of a section of the power transmission setup, wherein the image of the section represents the overhead power line carrying current and a non-current carrying element of the power transmission setup;
   analyzing the captured image to determine temperatures of the overhead power line and the non-current carrying element, wherein
      the temperature of the overhead power line is based on a heat generated by the carried current of the overhead power line and an environmental factor around the section of the power transmission setup, and
      the temperature of the non-current carrying element is based on the environmental factor; and
   using the determined temperatures of the overhead power line and the non-current carrying element for determining the lone temperature of the overhead power line.

2. A method according to claim 1, wherein determining the lone temperature of the overhead power line includes subtracting the determined temperature of the non-current carrying element from the determined temperature of the overhead power line.

3. A method according to claim 1, wherein the environmental factor includes at least one of: ambient temperature, humidity, wind.

4. A method according to claim 1, further comprising
   acquiring information related to formational-attributes of the overhead power line; and
   using the information related to the formational-attributes, along with the determined temperatures of the overhead power line and the non-current carrying element, for determining the lone temperature of the overhead power line.

5. A method according to claim 4, wherein the formational-attributes comprise at least one of: a material, an age and a surface treatment of the overhead power line.

6. A method according to claim 1, wherein capturing of the image of the section of the power transmission setup is carried out using an unmanned aerial vehicle.

7. A system for determining a lone temperature of an overhead power line of a power transmission setup, the system comprising:
   an image capturing module operable to capture an image of a section of the power transmission setup, wherein the image of the section represents the overhead power line carrying current and a non-current carrying element of the power transmission setup; and
   an image processing module operable to
      analyze the captured image to determine temperatures of the overhead power line and the non-current carrying element, wherein
         the temperature of the overhead power line is based on a heat generated by the carried current of the overhead power line and an environmental factor around the section of the power transmission setup, and
         the temperature of the non-current carrying element is based on the environmental factor, and
      use the determined temperatures of the overhead power line and the non-current carrying element to determine the lone temperature of the overhead power line.

8. A system according to claim 7, further comprising at least one database communicably coupled to the image processing module, the at least one database comprises formational-attributes of the overhead power line, wherein the image processing module is operable to use the formational-attributes along with the determined temperatures of the overhead power line and the non-current carrying element to determine the lone temperature of the overhead power line.

9. A system according to claim 7, wherein an unmanned aerial vehicle comprises the image capturing module and the image processing module.

10. A system according to claim 7, wherein an unmanned aerial vehicle is communicably coupled to a ground control station, and wherein the unmanned aerial vehicle comprises the image capturing module and the ground control station comprises the image processing module.

11. A system according to claim 9, wherein the unmanned aerial vehicle comprises at least one sensor.

12. A system according to claim 11, wherein the at least one sensor is one of an image sensor, a proximity sensor, a distance sensor, a motion sensor, an electromagnetic sensor.

13. A system according to claim 12, wherein the image sensor is an infrared sensor.

14. A system according to claim 7, further comprising a memory unit configured to store information associated with the captured image of the section, the determined temperatures, the formational-attributes and the at least one sensor.

15. A system according to claim 7, wherein the overhead power line and the non-current carrying element are conductor in nature.

16. A system according to claim 15, wherein the non-current carrying element is a lightning rod.

* * * * *